(12) United States Patent
Wanninger

(10) Patent No.: US 7,421,165 B2
(45) Date of Patent: Sep. 2, 2008

(54) COUPLING-IN DEVICE WITH PARTICULAR MONOLITHIC LENS ARRAY

(75) Inventor: Mario Wanninger, Sünching (DE)

(73) Assignee: Osram Opto Semiconductors GmbH, Regensburg (DE)

(*) Notice: Subject to any disclaimer, the term of this patent is extended or adjusted under 35 U.S.C. 154(b) by 7 days.

(21) Appl. No.: 10/690,110

(22) Filed: Oct. 21, 2003

(65) Prior Publication Data

US 2004/0156584 A1     Aug. 12, 2004

(30) Foreign Application Priority Data

Oct. 31, 2002   (DE) ................. 102 50 912

(51) Int. Cl.
G02B 6/26      (2006.01)
G02B 6/42      (2006.01)

(52) U.S. Cl. ........................................ 385/39
(58) Field of Classification Search ............. None
See application file for complete search history.

(56) References Cited

U.S. PATENT DOCUMENTS

| | | | |
|---|---|---|---|
| 4,826,269 A | 5/1989 | Streifer et al. | |
| 5,386,431 A * | 1/1995 | Tulip | 372/68 |
| 5,485,482 A * | 1/1996 | Selker et al. | 372/75 |
| 5,617,492 A * | 4/1997 | Beach et al. | 385/33 |
| 5,668,825 A * | 9/1997 | Karpinski | 372/101 |
| 5,790,576 A * | 8/1998 | Waarts et al. | 372/50.23 |
| 5,818,649 A * | 10/1998 | Anderson | 359/726 |
| 6,005,717 A * | 12/1999 | Neuberger et al. | 359/619 |
| 6,097,540 A * | 8/2000 | Neuberger et al. | 359/618 |
| 6,101,199 A * | 8/2000 | Wang et al. | 372/6 |
| 6,377,410 B1 * | 4/2002 | Wang et al. | 359/837 |
| 6,625,354 B2 * | 9/2003 | Hollister et al. | 385/36 |
| 6,694,077 B2 * | 2/2004 | Liu et al. | 385/47 |
| 6,741,777 B2 * | 5/2004 | Jewell et al. | 385/49 |
| 6,771,686 B1 * | 8/2004 | Ullman et al. | 372/92 |
| 6,879,435 B2 * | 4/2005 | Rice | 359/341.1 |
| 6,950,573 B2 * | 9/2005 | Ota et al. | 385/32 |
| 2002/0090172 A1 | 7/2002 | Okazaki et al. | |

FOREIGN PATENT DOCUMENTS

DE           102 45 526 A1   4/2004
WO   WO 2004/034112 A1   4/2004

* cited by examiner

*Primary Examiner*—T. L. Rude
(74) *Attorney, Agent, or Firm*—Cohen Pontani Lieberman & Pavane LLP

(57) ABSTRACT

A coupling-in device for light from a plurality of light sources (8) into an optical waveguide (1), the coupling-in device having a plurality of focussing optics (5) for the light from the various light sources (8).

13 Claims, 2 Drawing Sheets

COUPLING-IN DEVICE WITH PARTICULAR MONOLITHIC LENS ARRAY

This patent application claims the priority of German patent application 102 50 912.3, the disclosure content of which is hereby incorporated by reference.

FIELD OF THE INVENTION

The invention relates to a coupling-in device for light from a plurality of light sources into an optical waveguide.

BACKGROUND OF THE INVENTION

It has been possible hitherto to provide a number—dependent on the optical waveguide diameter—of light sources directly upstream of the optical waveguide, so that the light from the light sources is coupled into the optical waveguide. If more light sources are required e.g. in order to increase the brightness or for colour mixing purposes, it is already known to expand the end of the optical waveguide on the light source side in a funnel-shaped manner in order to increase the available coupling-in area at the end of the optical waveguide.

However, if the optical waveguide is expanded in a funnel-shaped manner on the light source side, the efficiency suffers since it is no longer the case that all the light beams obey the conditions of total reflection.

The situation is the same when the optical waveguide is split into a plurality of coupling-in strands on the light source side. Although a sufficient number of light sources can be arranged at the end areas of the coupling-in strands, losses likewise occur at the connecting points of the coupling-in strands with respect to one another and with respect to the optical waveguide.

SUMMARY OF THE INVENTION

One object of the invention is to provide a coupling-in device for light from a plurality of light sources into an optical waveguide which largely avoids losses.

This and other objects are attained in accordance with one aspect of the invention directed to a coupling-in device for light from a plurality of light sources into an optical waveguide, wherein the coupling-in device has a plurality of focussing optics for the light from the various light sources.

The light from the various light sources is concentrated by virtue of a plurality of focussing optics being integrated into the coupling-in device, so that significantly less area is required per light beam which is coupled into the optical waveguide.

Consequently, it is possible to couple into an optical waveguide via the coupling-in device light from significantly more light sources than has been possible hitherto through a direct arrangement of the light sources upstream of the end of the optical waveguide.

Ideally, a focussing optic is formed for each light source, so that all the light beams are coupled into the optical waveguide in a concentrated manner.

A further enhancement is achieved by virtue of the fact that the optical waveguide has a coupling-in area, which is likewise formed in focussing fashion. The focussing coupling-in area formed results in a further concentration of the light beams as a result of which light from even more different light sources can be coupled into the optical waveguide.

In accordance with a preferred embodiment, the coupling-in area is formed in circle- or sphere-segment-like fashion at the end of the optical waveguide and the focussing optics are likewise arranged in circle- or sphere-segment-like fashion in a manner spaced apart from the coupling-in area.

By virtue of the coupling-in area formed in circle- or sphere-segment-like fashion, on the one hand, a larger area is obtained for the entry of the light beams which, by virtue of the focussing action of the coupling-in area, can be introduced into the optical waveguide having a significantly smaller diameter.

The focussing optics are preferably likewise arranged in circle- or sphere-segment-like fashion and in a manner spaced apart around the coupling-in area. The focussing optics already concentrate the light, so that the light from a very high number of light sources can be coupled into the optical waveguide at the coupling-in area that is enlarged anyway.

In accordance with a preferred embodiment, the coupling-in device is formed in one piece with focussing optic and coupling-in area, it being possible to use the cost-effective production in the plastics injection molding method for this purpose.

As light sources it is possible to provide e.g. LEDs at the outer side of the coupling-in device.

The geometry of the coupling-in device and also the arrangement of the light sources are preferably coordinated with one another in such a way as to minimize the losses occurring between emission of the light and entry into the actual optical waveguide.

The coupling-in device according to the invention makes it possible, with an injection-moulded part that can be produced extremely cost-effectively, to couple light from a considerably increased number of light sources into an optical waveguide which, according to the prior art, would have been possible hitherto only by splitting the optical waveguide or by means of a funnel-shaped expansion.

BRIEF DESCRIPTION OF THE DRAWINGS

The invention is explained in more detail below using an exemplary embodiment illustrated in the drawings.

In the drawings.

DETAILED DESCRIPTION OF THE DRAWINGS

Figure 1:
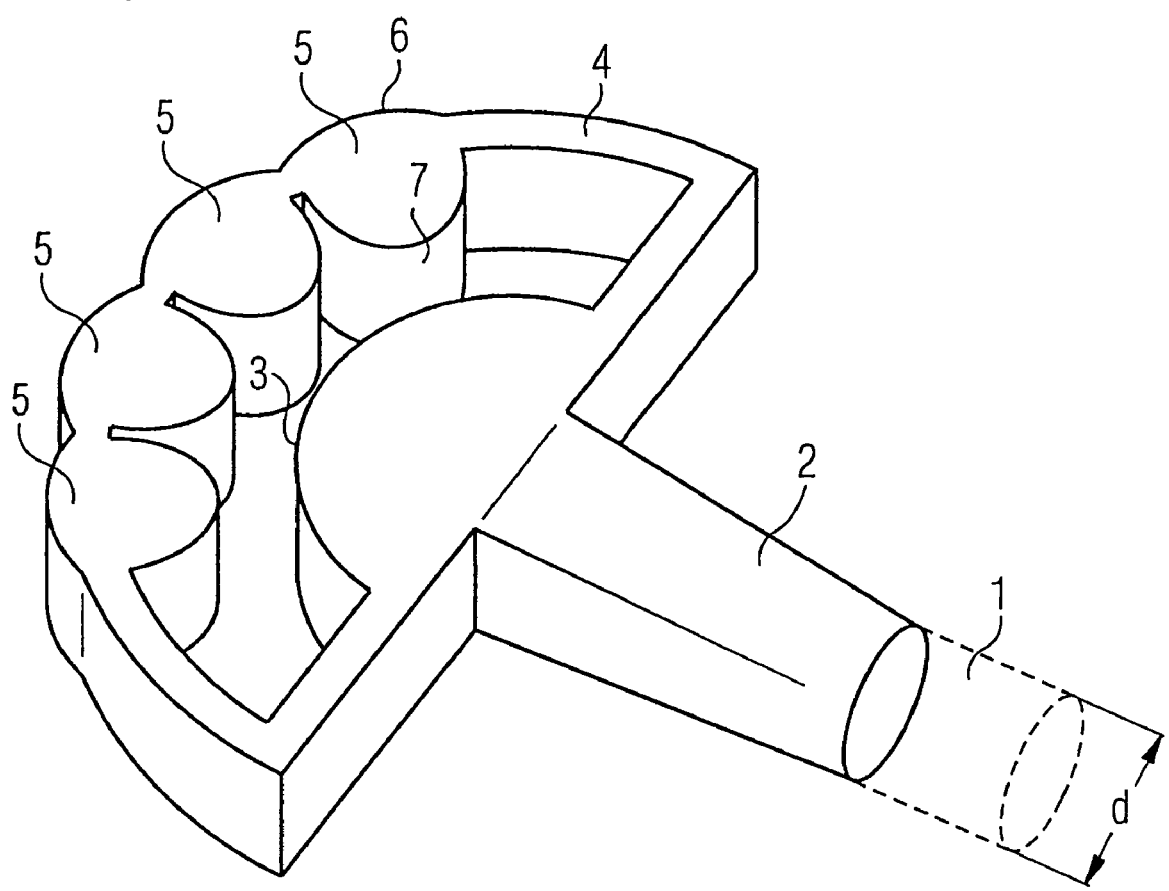
FIG. 1 shows an oblique view of the coupling-in device.

FIG. 1 shows an oblique view of a coupling-in device for light from a plurality of light sources 8 (depicted only in FIG. 2) into an optical waveguide 1. The optical waveguide 1 is illustrated only by broken lines in FIG. 1 and has a diameter d. The coupling-in device is provided with a stem 2 corresponding to the diameter of the optical waveguide 1. Depending on the application, the coupling-in device and the optical waveguide may also be formed in one part, i.e. without the stem 2.

A coupling-in area 3 for the optical waveguide is arranged at the end of the stem 2. The coupling-in area 3 may also be arranged directly at the optical waveguide 1 without the interposition of the stem 2.

The coupling-in area 3 is formed in focussing fashion and is realized as a semicircle segment in the exemplary embodiment illustrated. The coupling-in area 3 may also be realized as a sphere segment or as a segment of an ellipse.

The coupling-in area 3 is surrounded by a likewise circle-segment-like frame 4 in which four focussing optics 5 are integrated in accordance with the exemplary embodiment illustrated. The focussing optics 5 in each case have an outwardly curved area 6 and also an area 7 curved convexly inward in the direction of the coupling-in area 3.

In accordance with this exemplary embodiment, the frame 4 with the focussing optics 5 is also formed in semicircle-segment-like fashion.

The frame 4 may equally be formed as a sphere segment or circle segment having a smaller angle.

What is crucial, generally, is not the geometry of the arrangement of the focussing optics 5 and of the coupling-in area 3, but rather the co-ordination of the focussing optics 5 and the coupling-in area 3 with one another and the adaptation to the respective light source 8 used and the diameter of the optical waveguide 1.

Figure 2:
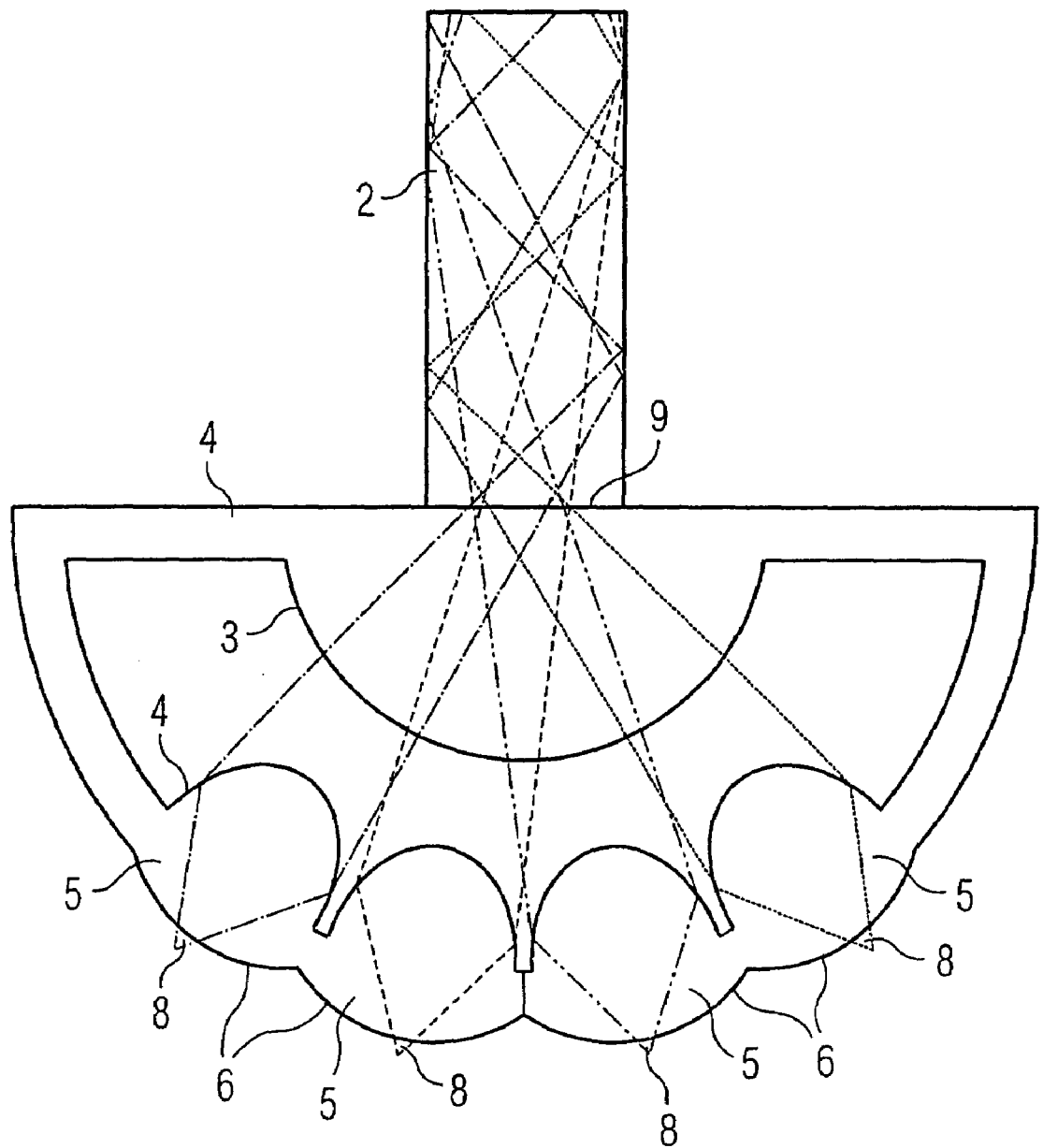
FIG. 2 shows a diagrammatic sectional view of the coupling-in device with radiation paths depicted.

FIG. 2 shows the coupling-in device in the view from above with a diagrammatic illustration of the coupling-in of light.

Light sources 8, which emit the light in the direction of the coupling-in area 3, are arranged centrally at the outer areas 6 of the focussing optics 5.

The light beam is focussed in the first stage by the inner convexly curved area 7 and the light beam is concentrated further by the focussing coupling-in area 3, so that, upon entry into the stem 2 or an optical waveguide 1 arranged directly instead of the stem 2, a very small cross section is required for the entry of the light beam. In the exemplary embodiment illustrated, the light beam enters at an end area 9 arranged between stem 2 and frame 4.

The end area 9 likewise corresponds to the cross section of the optical waveguide 1.

The effect whereby the light beams are already concentrated to a great extent at the end area 9 means that a plurality of light beams, four in the exemplary embodiment illustrated, can be coupled in via the end area 9 without losses occurring.

The geometry of the coupling-in device and the arrangement of the light sources 8 are co-ordinated with one another in such a way as to minimize the losses occurring between emission of the light and entry into the actual optical waveguide 1.

The coupling-in device is preferably produced as an injection-moulded part made of transparent plastic with a refractive index of n=1.50.

The coupling-in device according to the invention makes it possible to increase the brightness, since more light sources can effect coupling into an optical waveguide, and also affords the possibility of colour mixing, since it is possible to arrange a plurality of light sources per optical waveguide.

The problem of coupling as much light as possible from various light sources 8 into the optical waveguide 1 is solved in a simple and cost-effective manner by virtue of the integration of the focussing optic into the optical waveguide and also by virtue of the skilful arrangement of the light sources 8 at the outer areas 6 of the respective focussing optic 5.

The scope of protection of the invention is not restricted by the description of the invention on the basis of the exemplary embodiments. Rather, the invention encompasses any new feature and any combination of features, which, in particular, comprises any combination of features in the patent claims, even if this combination is not explicitly specified in the patent claims.

I claim:

1. A coupling-in device for light from a plurality of light sources into an end of an optical waveguide,
    wherein all of the light is coupled in via a coupling-in area that constitutes a single curved region that covers the entire end of the optical waveguide and which is curved in a focusing fashion, and
    wherein the coupling-in device has a plurality of focusing optics for the light from the various light sources, the focusing optics and the coupling-in area being produced in one single piece, the coupling-in area being surrounded by a frame in which the focusing optics are integrated, and
    wherein the coupling-in area, the frame, and the focusing optics together define a cavity between the coupling-in area and the focusing optics, and the coupling-in area is an inner surface adjoining the cavity.

2. The coupling-in device as claimed in claim 1, wherein a focusing optic is formed for each light source.

3. The coupling-in device as claimed in claim 1, wherein the geometry of the coupling-in area and the arrangement of the focusing optics are co-ordinated with the respective light source and the diameter of the optical waveguide.

4. The coupling-in device as claimed in claim 3, wherein the focusing optics are spaced apart from the coupling-in area.

5. The coupling-in device as claimed in claim 1, wherein said coupling-in device is produced from transparent plastic in an injection molding method.

6. The coupling-in device as claimed in claim 1, wherein LEDs arranged directly on the focusing optics are used as light sources.

7. The coupling-in device as claimed in claim 1, wherein the geometry of the coupling-in device and the arrangement of the light sources are co-ordinated with one another in such a way as to minimize the losses occurring between emission of the light and entry into the actual optical waveguide.

8. The coupling-in device as claimed in claim 1, wherein the coupling-in device is provided with a stem.

9. The coupling-in device as claimed in claim 8, wherein the coupling-in area and/or focusing optics are arranged around the end of the stem.

10. The coupling-in device as claimed in claim 8, wherein the diameter of the stem corresponds to the diameter of an optical waveguide which is attached to the stem.

11. The coupling-in device as claimed in claim 1, wherein the coupling-in area and/or focusing optics are arranged in circle-like fashion.

12. The coupling-in device as claimed in claim 1, wherein the coupling-in area, the frame, and the focusing optics define a continuous perimeter of the cavity.

13. The coupling-in device as claimed in claim 1, wherein the coupling-in area and/or focussing optics are arranged in circle- or sphere-segment-like fashion around the end of the optical waveguide.

* * * * *